United States Patent
Deshpande et al.

(10) Patent No.: US 6,960,510 B2
(45) Date of Patent: Nov. 1, 2005

(54) METHOD OF MAKING SUB-LITHOGRAPHIC FEATURES

(75) Inventors: Sadanand V. Deshpande, Fishkill, NY (US); Toshiharu Furukawa, Essex Junction, VT (US); David V. Horak, Essex Junction, VT (US); Wesley C. Natzle, New Paltz, NY (US); Akihisa Sekiguchi, Briarcliff Manor, NY (US); Len Y. Tsou, New City, NY (US); Qingyun Yang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/187,579

(22) Filed: Jul. 1, 2002

(65) Prior Publication Data

US 2004/0002203 A1 Jan. 1, 2004

(51) Int. Cl.⁷ ............... H01L 21/8238; H01L 21/8236; H01L 21/8234; H01L 21/336
(52) U.S. Cl. ............... 438/286; 438/199; 438/217; 438/275; 438/279
(58) Field of Search ............... 438/286, 199, 438/217, 275, 279

(56) References Cited

U.S. PATENT DOCUMENTS

| | | | |
|---|---|---|---|
| 3,904,462 A * | 9/1975 | Dimigen et al. | 216/51 |
| 3,988,823 A * | 11/1976 | Hu | 438/624 |
| 4,208,780 A | 6/1980 | Richman | |
| 4,997,779 A | 3/1991 | Kohno | |
| 5,068,707 A * | 11/1991 | Pors et al. | 257/311 |
| 5,281,500 A * | 1/1994 | Cathey et al. | 430/5 |
| 5,288,568 A * | 2/1994 | Cathey, Jr. | 430/5 |
| 5,354,716 A * | 10/1994 | Pors et al. | 438/396 |
| 5,444,007 A | 8/1995 | Tsuchiaki | |
| 5,459,085 A | 10/1995 | Pasen et al. | |
| 5,576,124 A * | 11/1996 | Ham | 430/5 |
| 5,651,857 A | 7/1997 | Cronin et al. | |
| 5,736,451 A * | 4/1998 | Gayet | 438/443 |
| 5,885,425 A | 3/1999 | Hsieh et al. | |
| 5,948,571 A * | 9/1999 | Mih et al. | 430/5 |
| 6,001,714 A | 12/1999 | Nakajima et al. | |
| 6,015,991 A * | 1/2000 | Wheeler et al. | 257/336 |
| 6,037,620 A | 3/2000 | Hoenigschmid et al. | |
| 6,043,000 A * | 3/2000 | Park et al. | 430/318 |
| 6,083,794 A | 7/2000 | Hook et al. | |
| 6,089,151 A * | 7/2000 | Cobbley et al. | 101/127 |
| 6,114,096 A * | 9/2000 | Mih et al. | 430/311 |
| 6,130,134 A | 10/2000 | Chen | |
| 6,187,657 B1 | 2/2001 | Xiang et al. | |
| 6,194,720 B1 * | 2/2001 | Li et al. | 250/311 |
| 6,225,229 B1 | 5/2001 | Huster | |
| 6,228,745 B1 * | 5/2001 | Wheeler et al. | 438/424 |
| 6,255,699 B1 | 7/2001 | Bracchitta et al. | |
| 6,269,742 B1 * | 8/2001 | Cobbley et al. | 101/127 |
| 6,285,050 B1 * | 9/2001 | Emma et al. | 257/296 |
| 6,534,418 B1 * | 3/2003 | Plat et al. | 438/739 |

\* cited by examiner

FOREIGN PATENT DOCUMENTS

JP          401260628 A    * 10/1989

Primary Examiner—Long Pham
Assistant Examiner—Shrinivas H. Rao
(74) Attorney, Agent, or Firm—Schmeiser, Olsen & Watts; William D. Sabo

(57) ABSTRACT

A method of forming a structure having sub-lithographic dimensions is provided. The method includes: forming a chamfered mandrel on a substrate, the mandrel having an angled surface; and performing an angled ion implantation to obtain an implanted shadow region in the substrate, the implanted shadow mask having at least one sub-lithographic dimension.

11 Claims, 17 Drawing Sheets

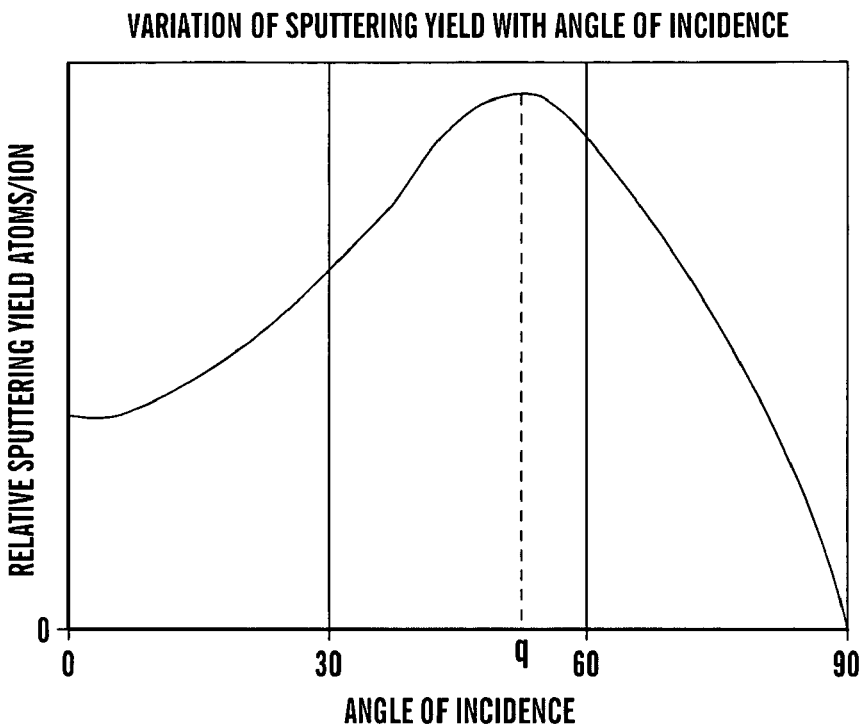
FIG. 3
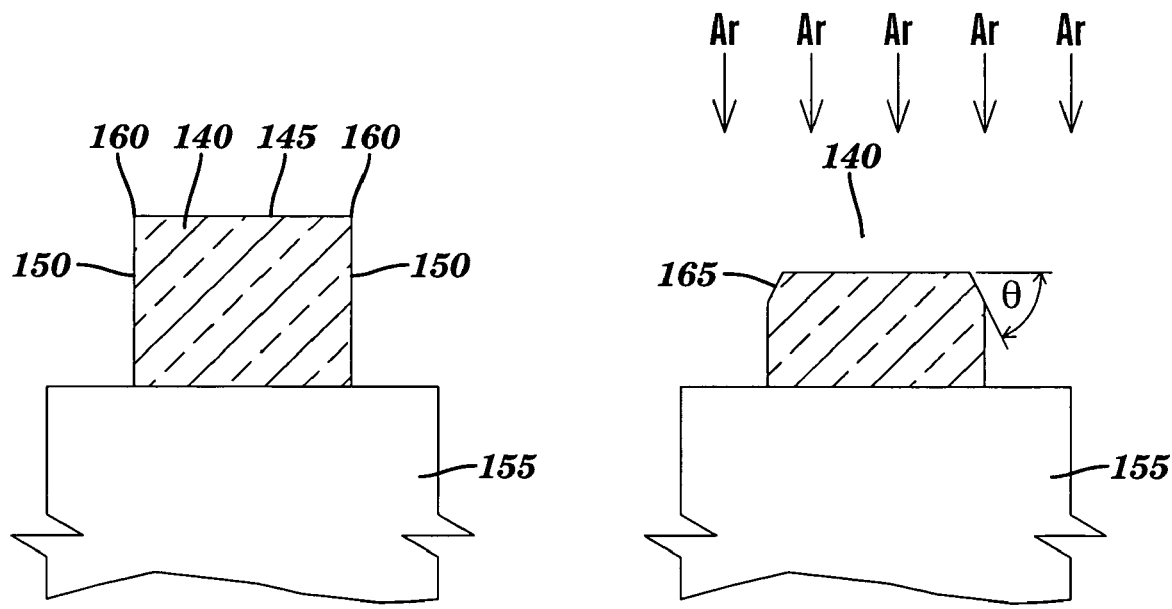
FIG. 4A  FIG. 4B

METHOD OF MAKING SUB-LITHOGRAPHIC FEATURES

FIELD OF THE INVENTION

The present invention relates to the field of semiconductor manufacture; more specifically, it relates to a method of fabricating structures having sub-lithographic dimensions.

BACKGROUND OF THE INVENTION

Optical lithography is one of the key processes driving the semiconductor industry. For example, in dynamic random access memories (DRAM), decreasing the minimum lithographic dimension (the smallest image that can be printed) has accounted for about 60% of the reduction in silicon area used by DRAM chips. For logic chips, channel length is one of the key components of performance (devices having shorter channels lengths are faster) and is driven to a significant extent by optical lithography and minimum lithographic dimensions.

However, as image sizes have shrunk, it has been increasingly difficult to print very small dimensions even with advanced lithographic tool and processes. To counter this difficulty, trim technology has been developed. In normal trim technology, the original image which is at the lithographic limit is "trimmed" to a sub-lithographic dimension but the dimensional tolerance on the trimmed image is not "trimmed" but is the same as on the original image, so tolerance does not scale with image size. Shadow trim allows sub-lithographic images to be formed and is illustrated in FIGS. 1 and 2 and described below. However, shadow trim technology suffers the problem that the edges of trimmed images are not "sharp" but "fuzzy." These two problems with normal and shadow trim technology lead to formation of devices that have a wide range of performance parameters that often offset the gains obtained by making the individual devices smaller.

FIG. 1 is partial cross-sectional view of a related art shadow lithographic process. FIGS. 1 and 2 illustrate shadow trim technology as applied to ion implantation. In FIG. 1, formed on a substrate 100 are shadow masks 105. Each shadow mask 105 has a shadow sidewall 110 and an exposed sidewall 115. Each shadow mask 105 is "H1" high and are spaced "W1" apart. An angled ion implantation (in the present example, $BF_2+$ ions at an angle $\phi$ is performed. Shadow sidewall 110 projects a shadow region 120 extending from shadow sidewall 110 into substrate 100 between shadow masks 105. Shadow region 120 is "S1" wide. "S1" is equal to "H1" ×tangent $\phi$. Shadow region 120 includes an un-implanted region 125 and a transition region 130. Extending from exposed sidewall 115 to shadow region 120 is a fully implanted region 135. Fully implanted region 135 is "D1" wide. "D1" is equal to "W1"–"S1." Transition region 130 is located between un-implanted region 125 and fully implanted region 135. The interface between un-implanted region 125 and transition region 130 is designated by the letter "B." The interface between transition region 130 and fully implanted region 135 is designated by the letter "A."

FIG. 2 is a plot of the relative amount of BF2+ implanted as a function of horizontal distance for the related art process illustrated in FIG. 1. In FIG. 2, it is seen that the width of transition region, which is the tolerance on "D1" (defined between points "A" and "B" in FIG. 1) is about 60 Å. Addition of 60 Å to the tolerance on "D1" (see FIG. 1) is unacceptable in technologies where the total tolerance allowed for all causes is 300 Å or less.

Clearly, what is needed is a method of forming sub-lithographic images having small transition regions and dimensional tolerances that scale with the image dimensions.

SUMMARY OF THE INVENTION

A first aspect of the present invention is a method of forming a structure having sub-lithographic dimensions, comprising: forming a chamfered mandrel on a substrate, the mandrel having an angled surface; and performing an angled ion implantation to obtain an implanted shadow region in the substrate, the implanted shadow region having at least one sub-lithographic dimension.

A second aspect of the present invention is a method of forming a structure having sub-lithographic dimensions, comprising: forming a chamfered mandrel on a substrate, the mandrel having a vertical sidewall, a top surface and an angled surface, the angled surface connecting the vertical sidewall to the top surface; and performing an angled ion implantation to obtain an implanted shadow region in the substrate, the implanted shadow region having at least one sub-lithographic dimension.

A third aspect of the present invention is a method of forming a structure having sub-lithographic dimensions, comprising the steps of: (a) forming a first hard mask layer on a substrate; (b) forming a chamfered mandrel on the substrate, the mandrel having a vertical sidewall, a top surface and an angled surface, the angled surface connecting the vertical sidewall to the top surface; (c) forming a second hard mask layer over the chamfered mandrel and portions of the first hard mask not protected by the chamfered mandrel; (d) performing an angled ion implantation into the second hard mask layer to form an implanted region and an un-implanted region in the second hard mask layer; (e) removing either the un-implanted region or the implanted region; and (f) removing portions of the first hard mask layer exposed by step (e) to form an image in the first hard mask layer, said image having at least one sub-lithographic dimension.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 3 is a plot of angle of incidence versus relative sputtering yield for a sputtering process according to the present invention;

FIGS. 4A and 4B are partial cross-sectional views illustrating edge oblation during a sputtering process according to the present invention;

DETAILED DESCRIPTION OF THE INVENTION

Figure 1:
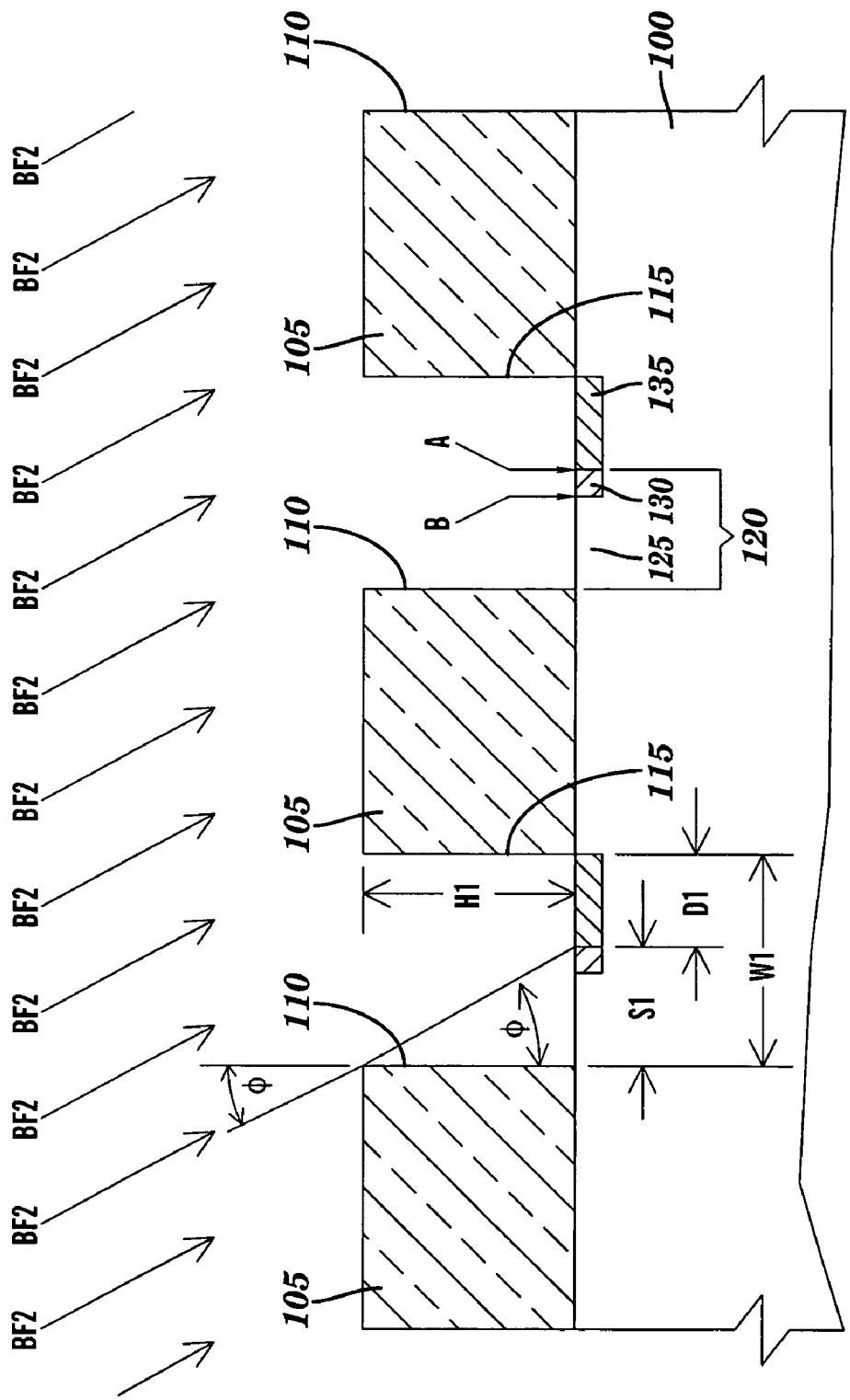
FIG. 1 is partial cross-sectional view of a related art shadow lithographic process.
Figure 2:
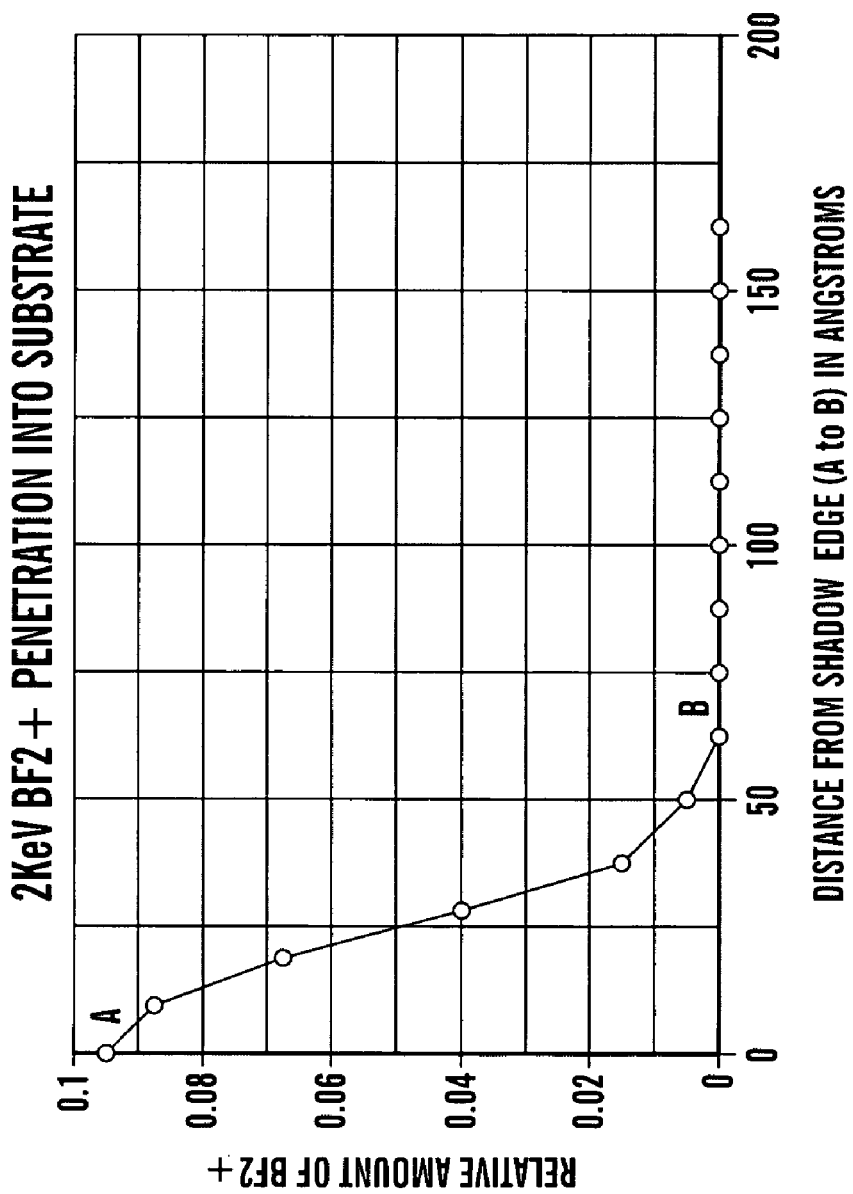
FIG. 2 is a plot of the relative amount of $BF_2+$ implanted as a function of horizontal distance for the related art process illustrated in FIG. 1.

FIG. 3 is a plot of angle of incidence versus relative sputtering yield for a sputtering process according to the present invention. Incident angle is defined as the angle between a line normal to the surface of the target and the direction of the sputtering species, a 0° degree incident angle being perpendicular to the surface of the target. The peak-sputtering rate is found to occur at the incident angle θ, where θ is about 53° and is generally independent of the material of being sputtered and the sputtering species.

FIGS. 4A and 4B are partial cross-sectional views illustrating edge ablation during a sputtering process according to the present invention. In FIG. 4A, a projecting structure 140 having a top surface 145 and sidewalls 150 is formed on a substrate 155. Sidewalls 150 meet top surface 145 in edges 160.

In FIG. 4B, chamfered structure 140A is formed by subjecting projecting structure 140 (see FIG. 4A) to about a 0° sputtering process that preferentially attacks edges 160 (see FIG. 4A) to produce angled surfaces 165. Angled surfaces 165 are formed at about the same angle θ illustrated in FIG. 3 and described above. In FIG. 4B, θ is measured from top surface 145 to angled surface 165. The angle θ is about 53° (the peak of the sputtering yield curve of FIG. 3).

Figure 5A:
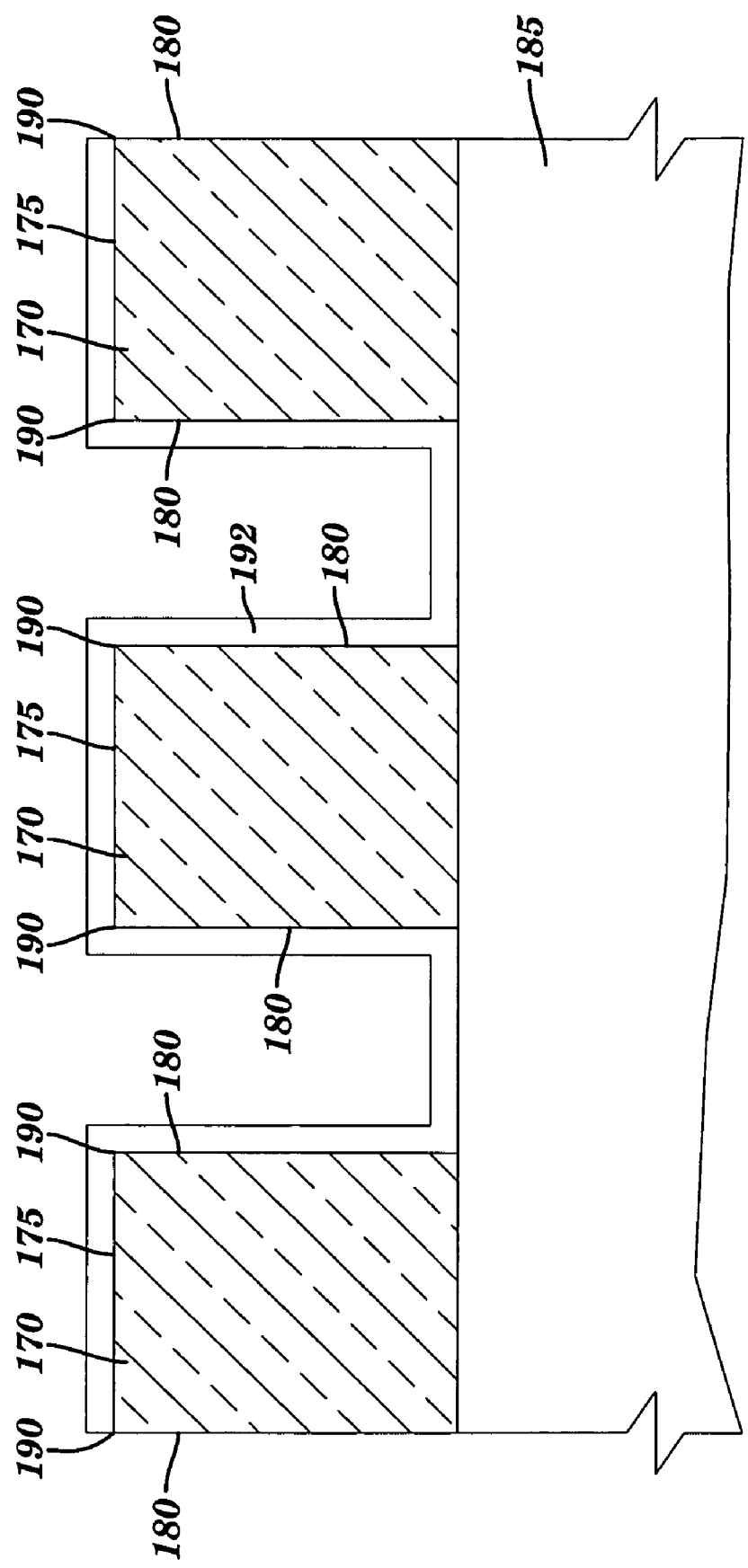
FIGS. 5A through 5C are partial cross-sectional views illustrating a first embodiment of the present invention.
Figure 5B:
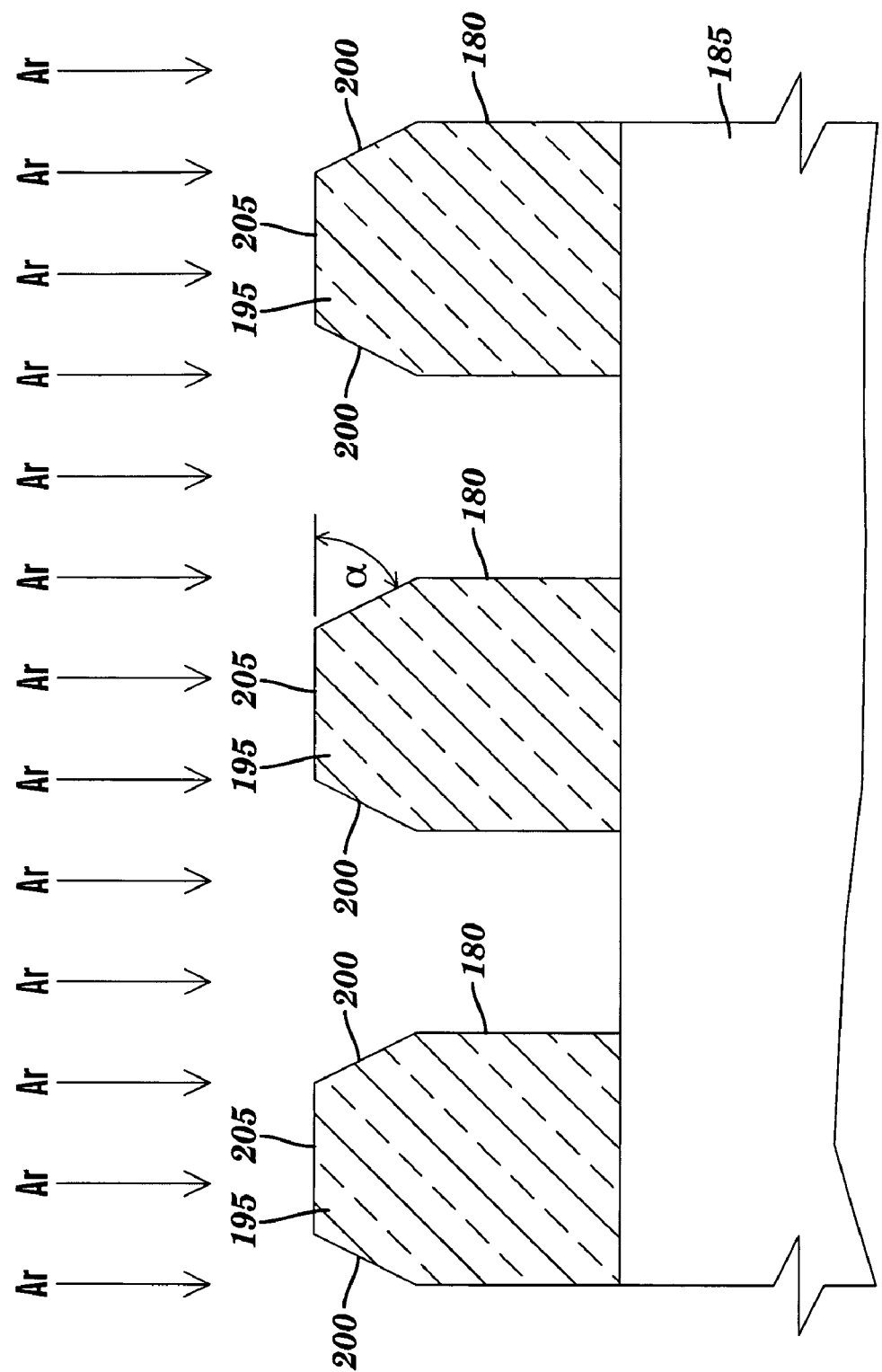
Figure 5C:
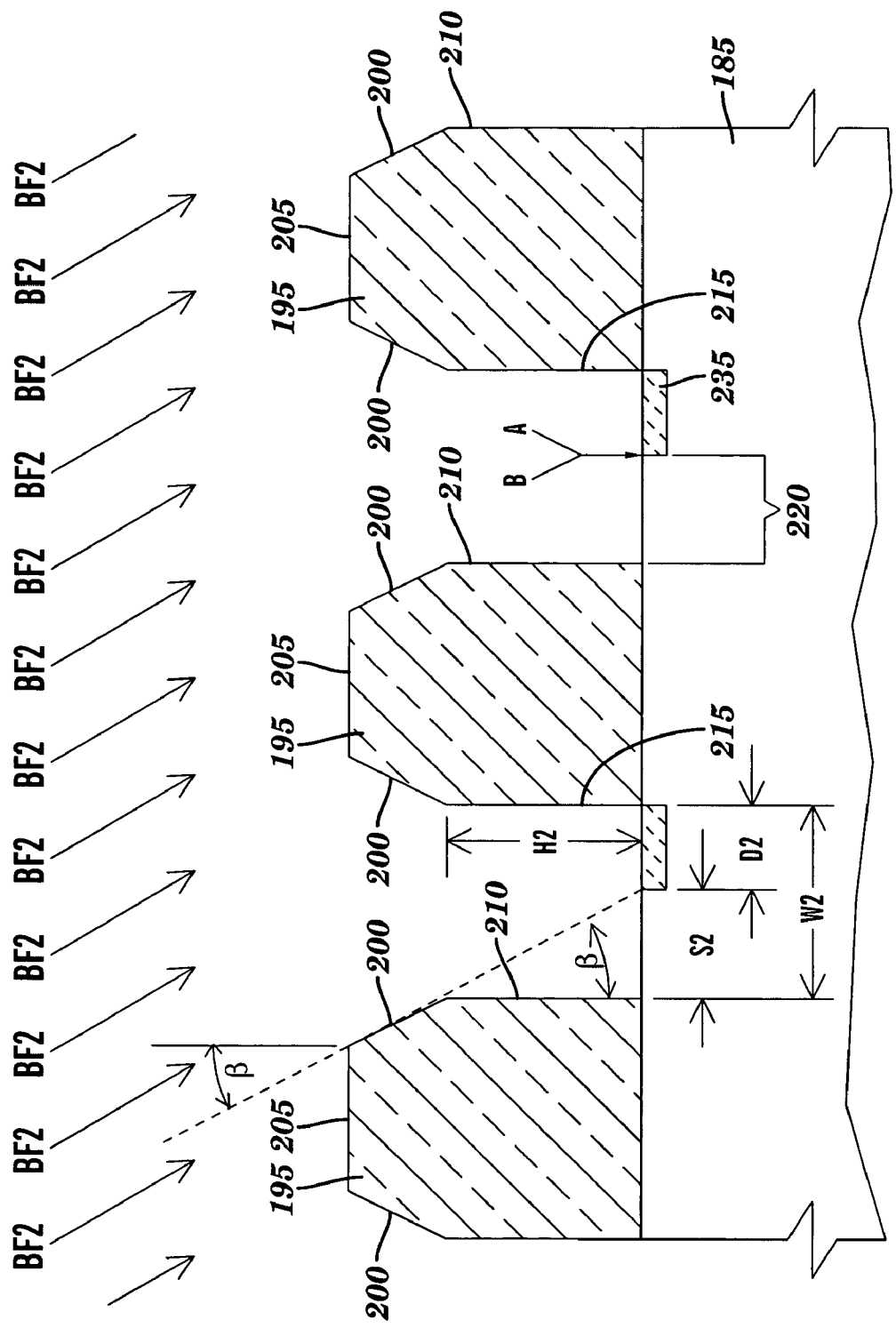

FIGS. 5A through 5C are partial cross-sectional views illustrating a first embodiment of the present invention. In FIG. 5A, mandrels 170 having top surfaces 175 and sidewalls 180 are formed on a substrate 185. Sidewalls 180 meet top surfaces 175 in edges 190. An optional, thin conformal layer 192 may be formed over mandrels 170 and substrate 185 where the substrate is not covered by mandrel. Conformal layer 192 is used as a sputtering endpoint detection layer allowing tight control of the sputtering process.

In FIG. 5B, mandrels 170 (see FIG. 5A) are subjected to a sputtering process in order to produce chamfered mandrels 195 having angled surfaces 200. Conformal layer 192 (see FIG. 5A) is removed by the sputtering process and an isotropic etch to expose sidewalls 180. Angled surfaces 200 are formed at an angle α measured from top surfaces 205 to angled surfaces 200. In one example, the sputtering species is Ar, substrate 185 is silicon, mandrels 195 are $SiO_2$ and the angle α is about 53°. Other examples of sputtering species include $N_2$ and Ne. Suitable tools for sputtering $SiO_2$ in Ar ions include the AME 5000 and AME 8300 (hexode system manufactured by Applied Materials Corp, Santa Clara, Calif. In general, lower the pressure and/or higher power enhance the sputtering rate. Chamfered mandrel 195 may be formed of thermal oxide, tetraethoxysilane (TEOS) oxide, high-pressure deposition (HDP) oxide, silicon nitride, polysilicon, photoresist and combinations thereof.

In FIG. 5C, chamfered mandrels 195 each have a shadow sidewall 210 and an exposed sidewall 215. Shadow and exposed sidewalls 210 and 215 are "H2" high and are spaced "W2" apart. An angled ion implantation at an incident angle of β is performed. In one example, β is equal to about α to α±δ, where δ is about 0° to 1° (see FIG. 5B) The lower δ, the sharper the edge of implanted 235. In the present example, $BF_2+$ ions are implanted at an incident angle of about 52° to 54°. Stated generally, the angle of incidence (β) of the implanted species is equal to or slightly lesser or sightly greater than the angle (α) of angled surface 200 (see FIG. 5B). Shadow sidewall 210 projects a shadow region 220 extending from shadow sidewall 210 onto substrate 185 between mandrels 195. Shadow region 220 is substantially un-implanted, is "S2" wide and is self aligned from shadow sidewall 210. "S2" is equal to about "H2" ×tangent (β−δ) to "H2" ×tangent (β+δ). Extending from exposed sidewall 215 to shadow region 220 is an implanted region 235. Implanted region 235 is "D2" wide. "D2" is equal to "W2"−"S2." If "W2" is a minimum lithographic dimension, then "D2" is a sub-lithographic dimension and implanted region 235 is a sub-lithographic feature. The interface between shadow region 220 and implanted region 235 is designated by the letters "A" and "B."

One skilled in the art would be aware that chamfered mandrels 195 may be formed on top of a protective layer formed on the top surface of substrate 185, the purpose of the protective layer being to protect the substrate from the sputtering step, the ion implant step or both and that all or a portion of the protective layer may be removed by the sputtering step or by a purposeful removal step prior to or after the ion implantation step.

Figure 6:
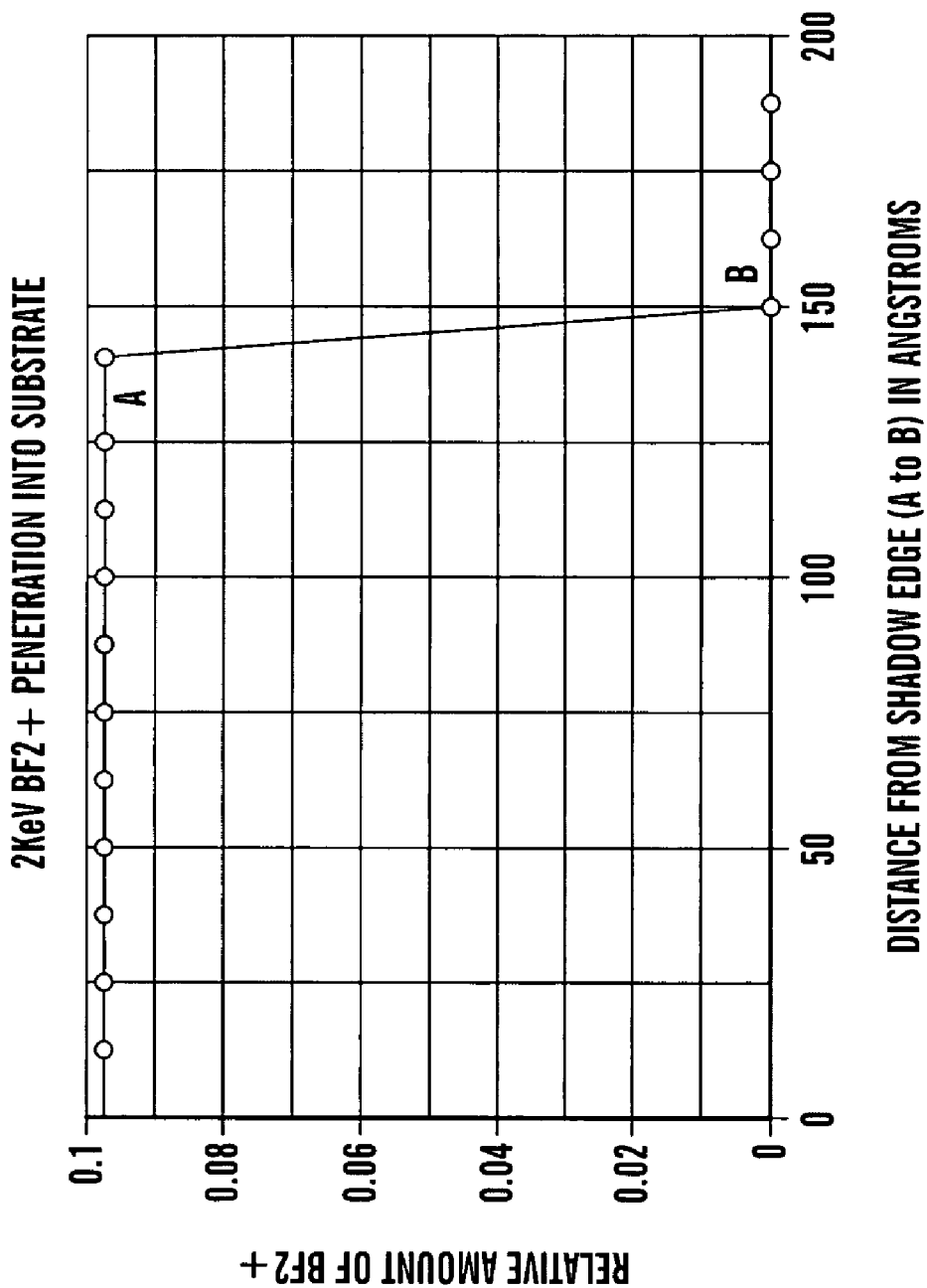
FIG. 6 is a plot of the relative amount of $BF_2+$ implanted as a function of horizontal distance for the first embodiment of the present invention illustrated in FIGS. 5A through 5C.

FIG. 6 is a plot of the relative amount of $BF_2+$ implanted as a function of horizontal distance for the first embodiment of the present invention illustrated in FIGS. 5A through 5C. In FIG. 6, it is seen that the width of transition region, which is the tolerance on "D2" (defined between points "A" and "B" in FIG. 5C) is less than 10 Å. The tolerance on the sub-lithographic image, in this case, implanted region 235 (see FIG. 5C) is small because of the sharp transition between points "A" and "B." Other ion implant species include other boron containing ions, and ions containing arsenic, phosphorus, hydrogen, helium, oxygen, nitrogen and germanium.

Figure 7A:
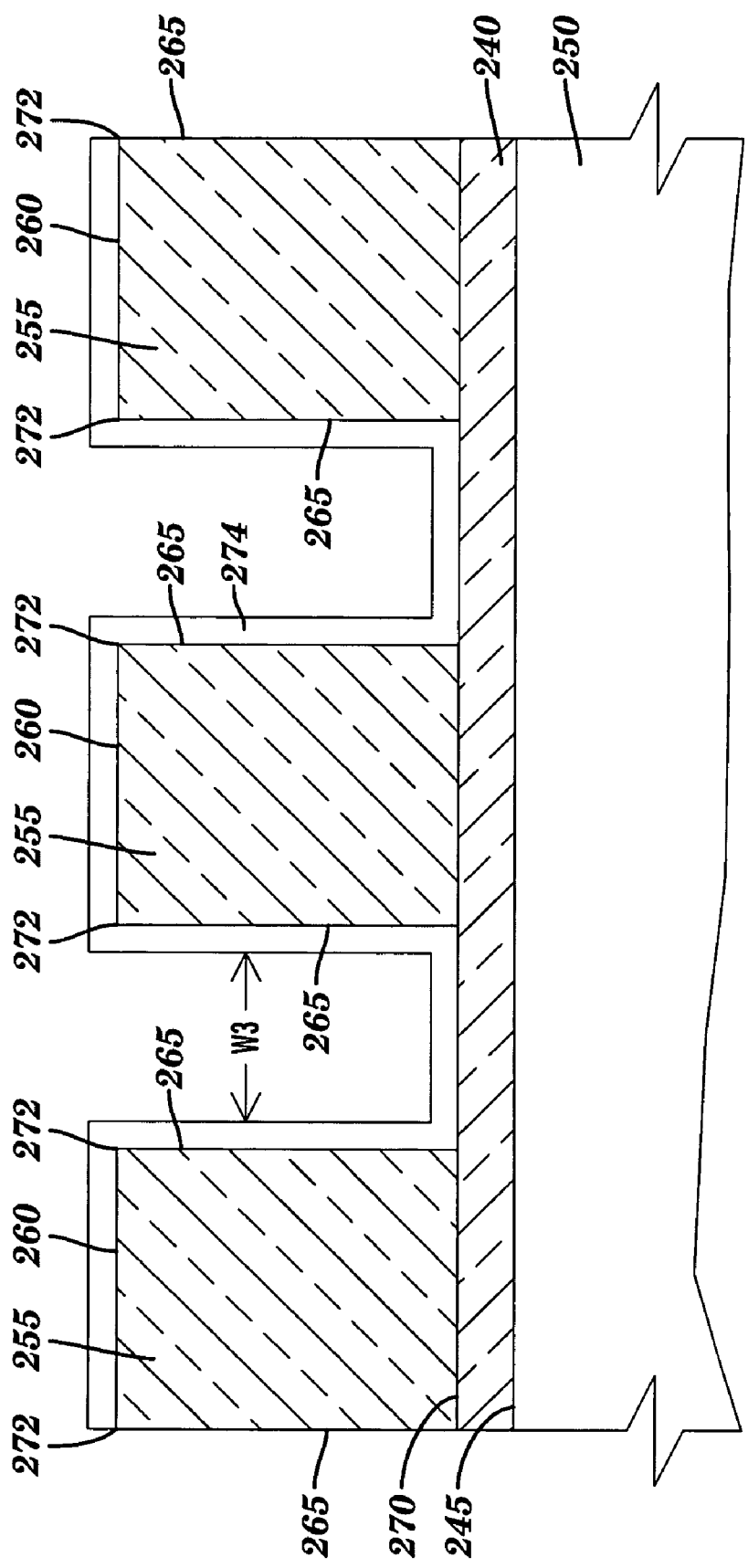
FIGS. 7A through 7D are partial cross-sectional views illustrating common process steps for second and third embodiments of the present invention.

FIGS. 7A through 7D are partial cross-sectional views illustrating common process steps for second and third embodiments of the present invention. In FIG. 7A, a first hard mask layer 240 is formed on a top surface 245 of a substrate 250. Mandrels 255 having a top surfaces 260 and sidewalls 265 are formed on a top surface 270 of first hard mask layer 240. Mandrels 255 are spaced "W3" apart. Sidewalls 265 meet top surfaces 260 in edges 272. An optional, thin conformal layer 274 may be formed over mandrels 255 and mask layer 240 where the mask layer is not covered by mandrel. Conformal layer 274 is used as a sputtering endpoint detection layer.

Figure 7B:
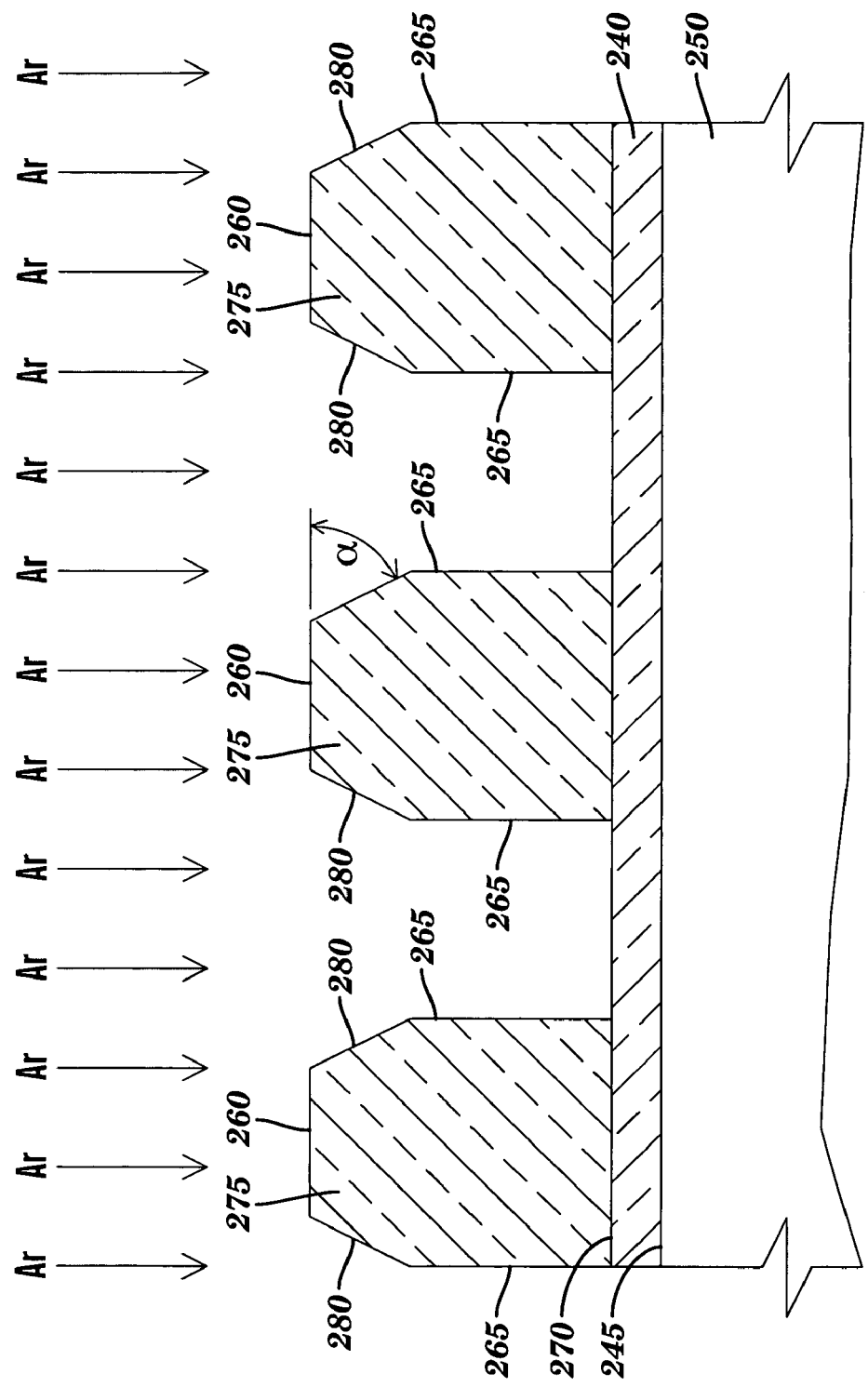

In FIG. 7B, mandrel 255 (see FIG. 7A) is subjected to a sputtering process in order to produce a chamfered mandrel 275 having angled surfaces 280. Conformal layer 274 (see FIG. 7A) is removed by the sputtering process and an isotropic etch to expose sidewalls 265. Angled surfaces 280 are formed at an angle α measured from top surface 260 to angled surface 280. In one example, the sputtering species is Ar and the angle α is about 52° to 54°. Other sputtering species include $N_2$ and Ne. During the sputtering process, none to some of first hard mask layer 240 exposed between chamfered mandrels 275 may be removed. FIG. 7B and subsequent figures, illustrate the case in which first hard mask layer 240 is substantially un-sputtered by the sputtering process.

Figure 7C:
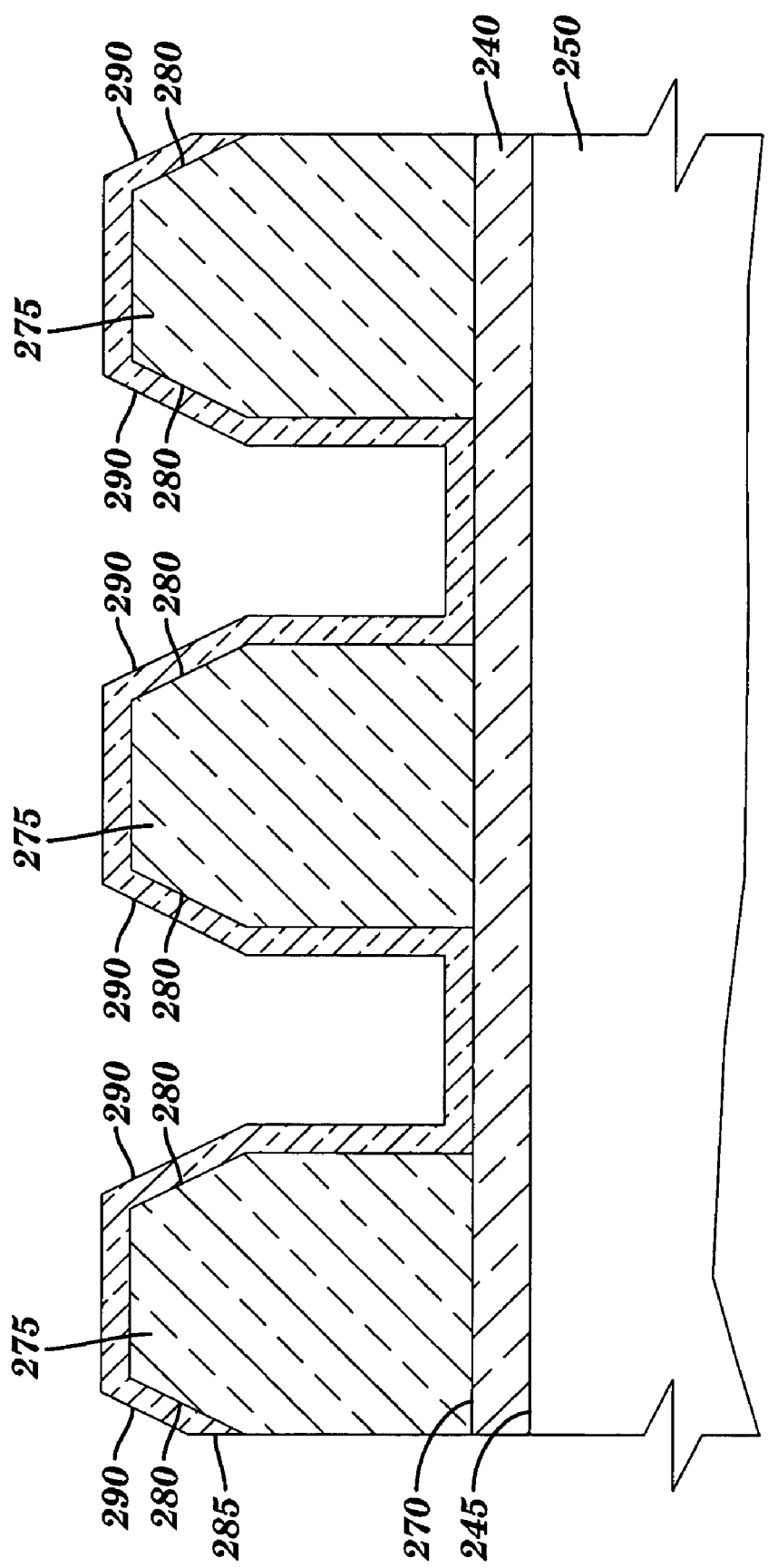

In FIG. 7C, a conformal second hard mask layer 285 is formed over chamfered mandrels 275 and first hard mask layer 240 exposed between the chamfered mandrels. Angled surface 280 of chamfered mandrel 275 is replicated in an angled surface 290 of second hard mask layer 285.

Figure 7D:
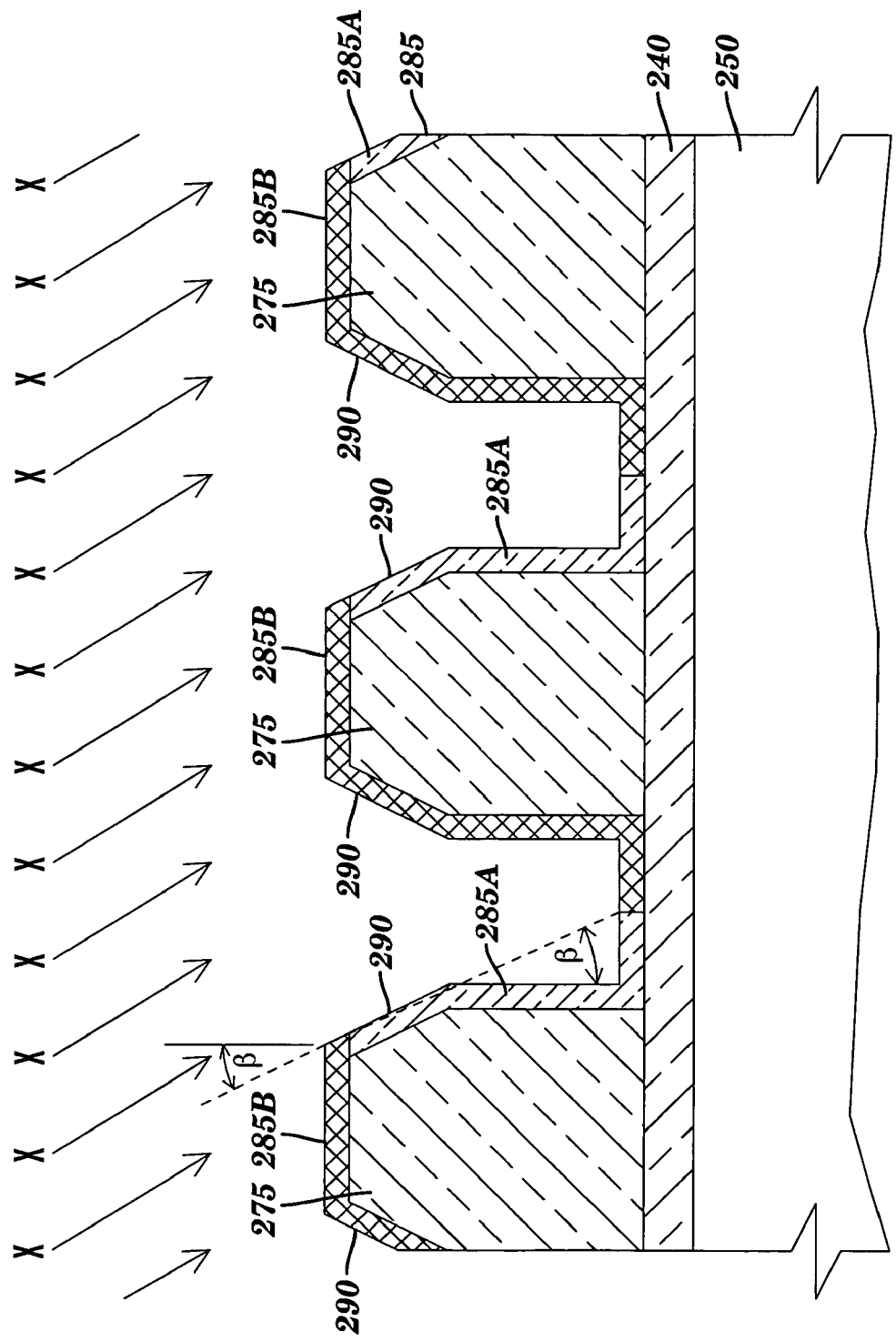

In FIG. 7D, an angled ion implantation at an incident angle of β is performed. In one example, β is equal to about α to α±δ, where δ is about 1° (see FIG. 7B) Stated generally, the angle of incidence (β) of the implanted species is equal to or slightly lesser or slightly greater than the angle (α) of angled surface 280. The ion implant species is designated "X" in FIG. 7D. Ion implant species "X" strikes second protective layer 285 only where the second protective layer is not "shadowed" by chamfered mandrel 275 to form un-implanted regions 285A and implanted regions 285B of second protective layer 285. Un-implanted regions 285A and implanted regions 285B of second protective layer 285 have different physical and/or chemical attributes either upon implantation or subsequent to an activation or conversion process such as a heat treatment. Because un-implanted regions 285A and implanted regions 285B each have different chemical properties one may be removed (etched) selectively with respect to the other.

Figure 8A:
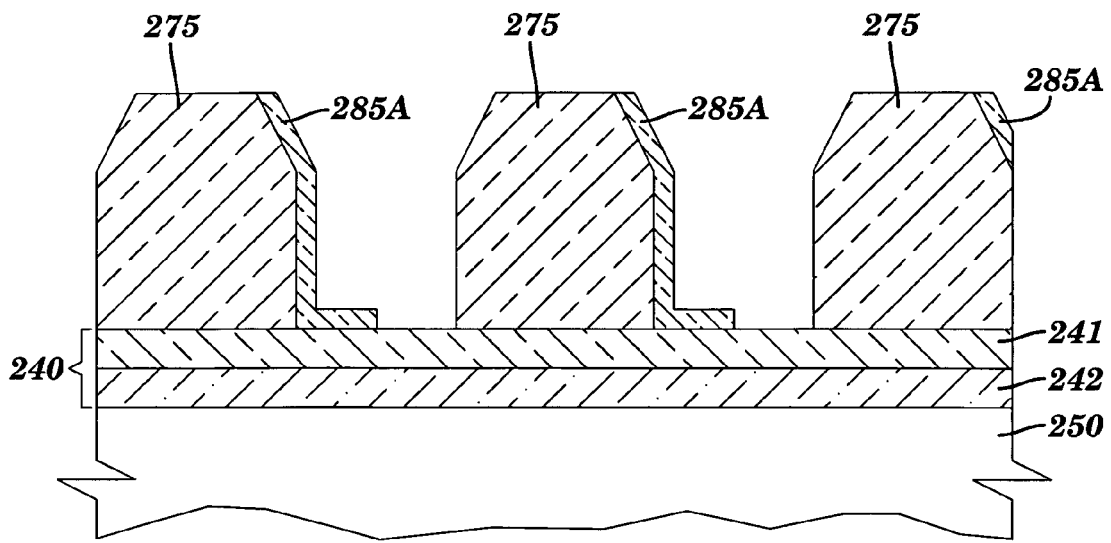
FIGS. 8A through 8E are partial cross-sectional views illustrating process steps of the second embodiment of the present invention.

FIGS. 8A through 8D are partial cross-sectional views illustrating process steps of the second embodiment of the present invention. FIG. 8A, continues processing from FIG. 7D and in a first example, substrate 250 is silicon, first protective layer 240 comprises a layer of $Si_3N_4$ over $SiO_2$, chamfered mandrel 275 is HDP oxide or TEOS oxide, second protective layer 285 is polysilicon and the implant species "X" is boron or phosphorous (see FIG. 7D) will be used in describing FIGS. 8A through 8D.

Figure 8B:
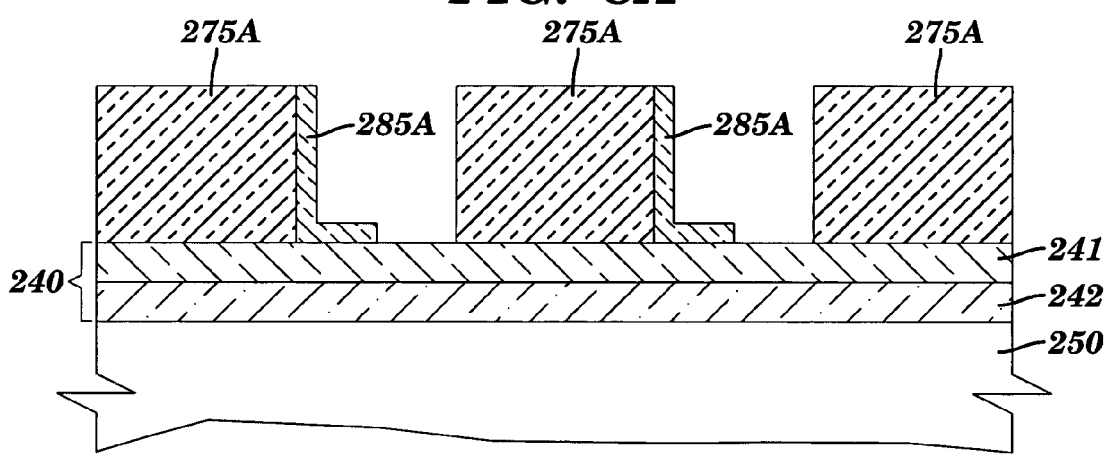
Figure 8C:
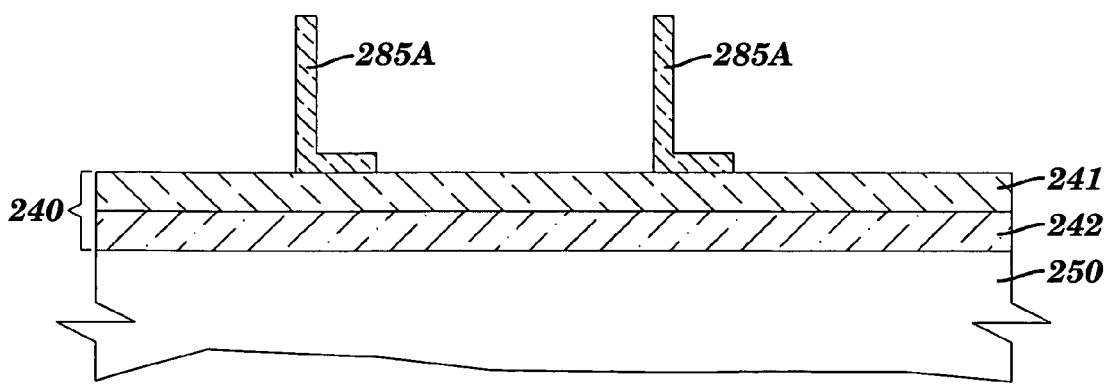
Figure 8D:
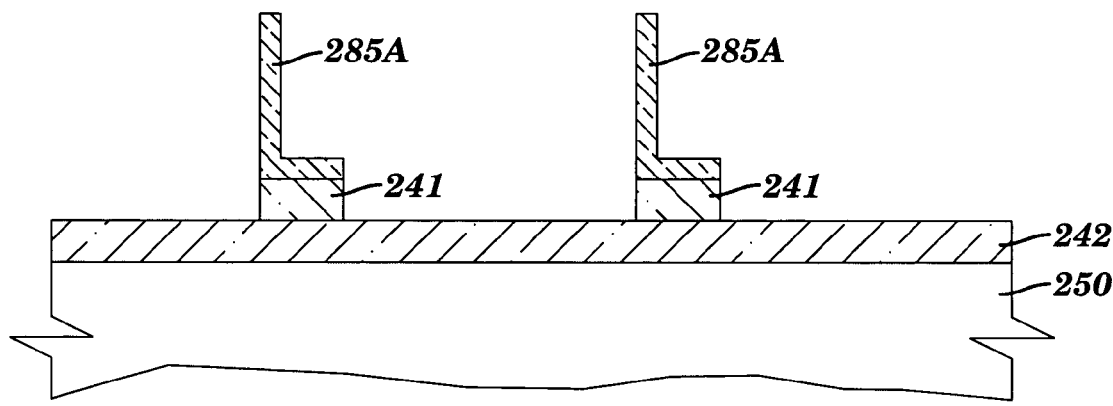
Figure 8E:
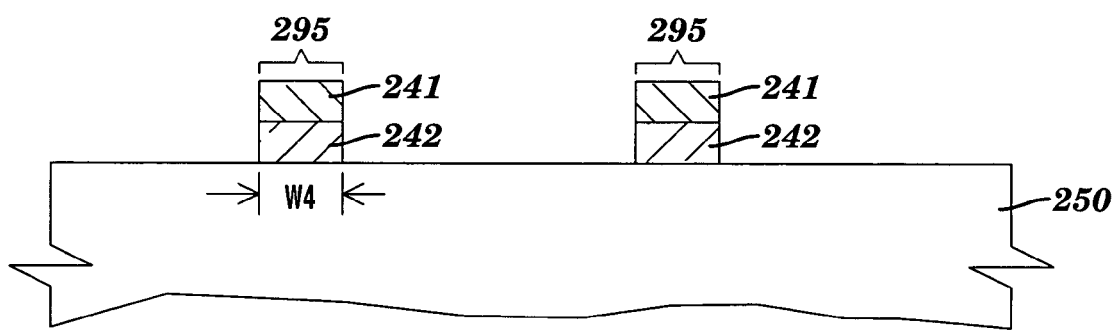

In FIG. 8A, first protective layer 240 comprises an upper layer 241 of $Si_3N_4$ over a lower layer 242 of $SiO_2$. In FIG. 8A, implanted regions 285B of second hard mask layer 285 (see FIG. 7D) are removed using KOH, leaving behind un-implanted regions 285A. KOH etches doped polysilicon faster than un-doped polysilicon. In FIG. 8B, a chemical-mechanical-polish (CMP) processes is performed to remove upper portions of chamfered mandrel 275 (see FIG. 8A) to produce mandrels 275A. In FIG. 8C, mandrels 275A (see FIG. 8B) are removed using dilute or buffered HF. In FIG. 8D, upper layer 241 of first hard mask layer 240 (see FIG. 8C) is removed where the upper layer is not protected by un-implanted regions 285A using any one of well-known reactive ion etch (RIE) processes selective $Si_3N_4$ to $SiO_2$ or wet etch chemistries. In FIG. 8E, un-implanted regions 285A (see FIG. 8D) are removed using KOH and lower layer 242 is removed using dilute or buffered HF where the lower layer is not protected by upper layer 241 to form islands 295. Islands 295 have a width "W4."

If, in FIG. 7A, "W3" is a minimum lithographic dimension, then "W4" is a sub-lithographic dimension and islands 295 are sub-lithographic features.

In a second example, substrate 250 is silicon, first protective layer 240 comprises a layer of $Si_3N_4$ over $SiO_2$, chamfered mandrel 275 is $SiO_2$, second protective layer 285 is polysilicon and the implant species "X" is oxygen (see FIG. 7D). The oxygen implantation converts polysilicon to $SiO_2$, (a heat cycle may be performed to fully convert the silicon to $SiO_2$) which may be etched in dilute or buffered HF.

Figure 9A:
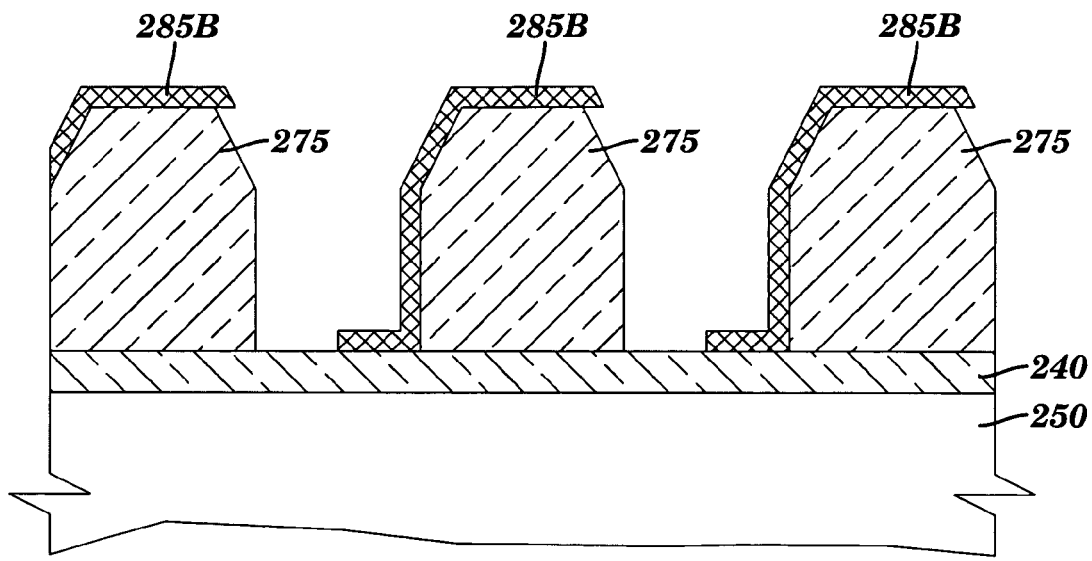
FIGS. 9A through 9C are partial cross-sectional views illustrating process steps of the third embodiment of the present invention.
Figure 9B:
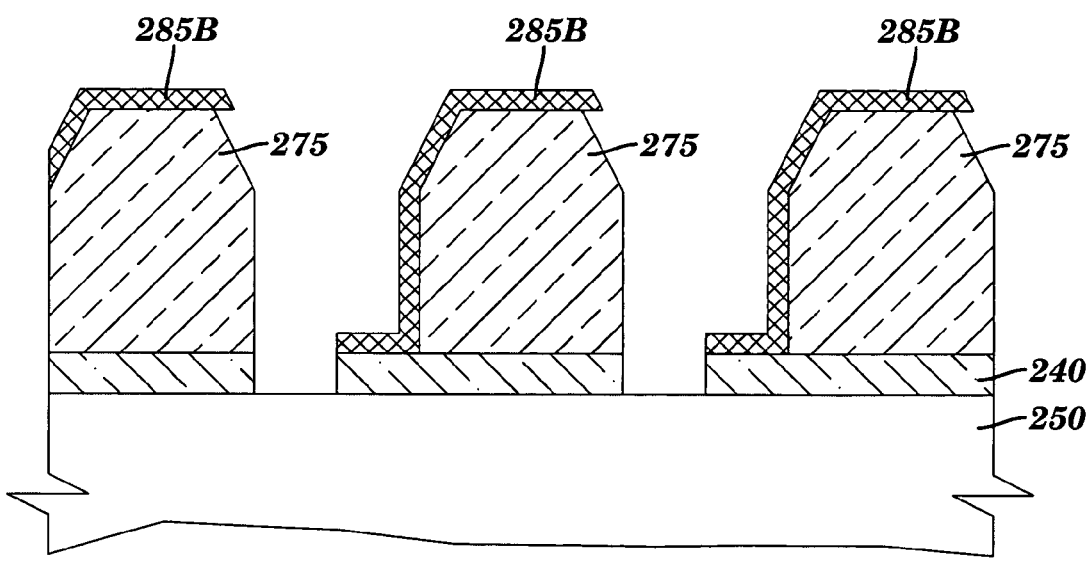
Figure 9C:
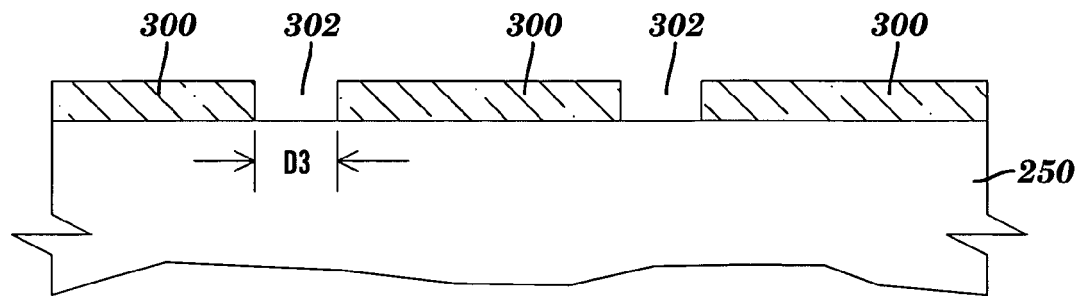

FIGS. 9A through 9C are partial cross-sectional views illustrating process steps of the third embodiment of the present invention. FIG. 9A, continues processing from FIG. 7D and an example wherein, substrate 250 is silicon, first protective layer 240 is $Si_3N_4$, chamfered mandrel 275 is HDP oxide or TEOS oxide, second protective layer 285 is polysilicon or $Si_3N_4$ and the implant species "X" is oxygen (see FIG. 7D) will be used in describing FIGS. 9A through 9C.

In FIG. 9A, implanted regions 285B are converted to $SiO_2$ if second protective layer 285 is polysilicon and un-implanted regions 285A (see FIG. 7D) are removed using KOH. If second protective layer 285 is Si3N4, implanted regions 285B are converted to $Si_xON_y$ and un-implanted regions 285A are removed using and RIE process or wet etch process. In FIG. 9B, first protective layer 240 is removed where the first protective layer is not protected by chamfered mandrels 275 or implanted regions 285B using any one of well-known RIE processes. In FIG. 9C, chamfered mandrels 275 and implanted regions 285B are removed using dilute or buffered HF leaving islands 300. Islands 300 are spaced apart a distance "D3."

If, in FIG. 9A, "W3" is a minimum lithographic dimension, then "D3" is a sub-lithographic dimension and images 302 (between islands 300) are sub-lithographic features.

Figure 10:
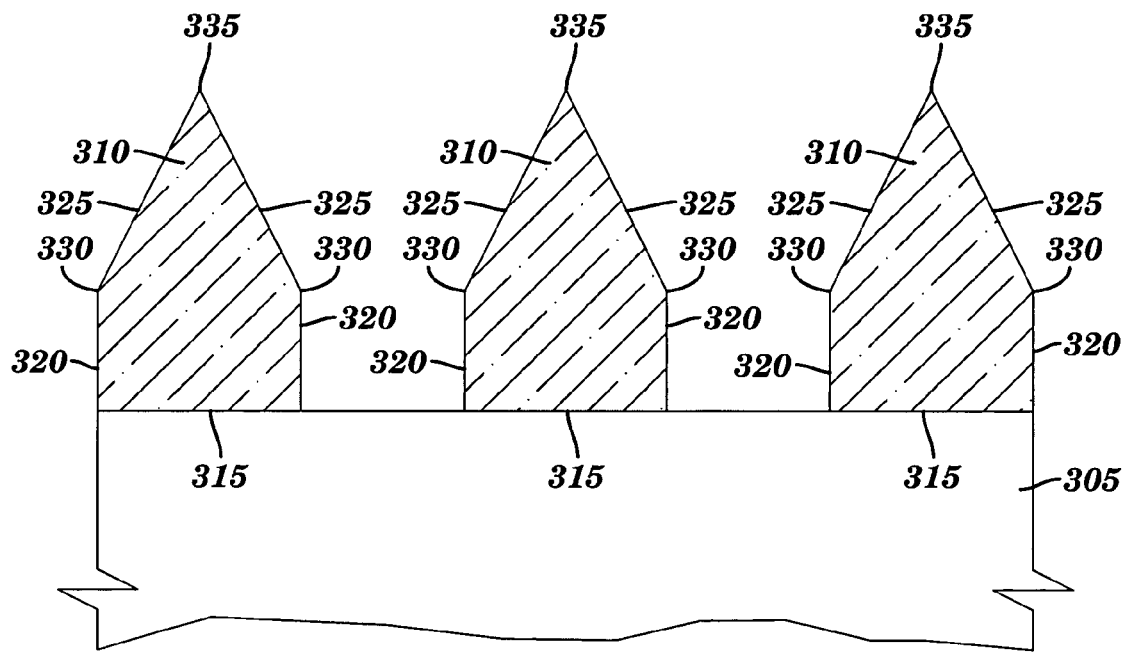
FIG. 10 is a partial cross-sectional view illustrating an alternative shape for mandrels of the present invention.

FIG. 10 is a partial cross-sectional view illustrating an alternative shape for mandrels of the present invention. In FIG. 10, formed on substrate 305 are mandrels 310. Mandrels 310 have a base 315 in contact with substrate 305, at least two vertical sides 320 extending up from the base and at least two angled sides 325 each meeting one vertical side an along edge 330. Angled sides 325 extend upward from vertical sides 320 to meet in an edge 335. Mandrel 310 is formed by extending the sputtering process illustrated in FIGS. 3, 4A and 4B and described above until edge 335 is formed.

Figure 11A:
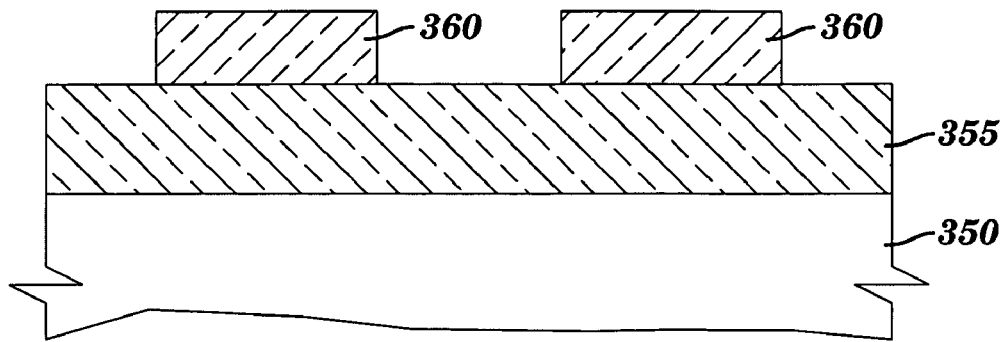
FIGS. 11A through 11D are partial cross-sectional views illustrating a fourth embodiment of the present invention.

FIGS. 11A through 11D are partial cross-sectional views illustrating a fourth embodiment of the present invention. In FIG. 11A, formed on a substrate 350 is a mandrel precursor layer 355. Layer 355 may formed from thermal oxide, TEOS oxide, HDP oxide, silicon nitride, polysilicon and combinations thereof. Formed on mandrel precursor layer 355 are photoresist islands 360.

Figure 11B:
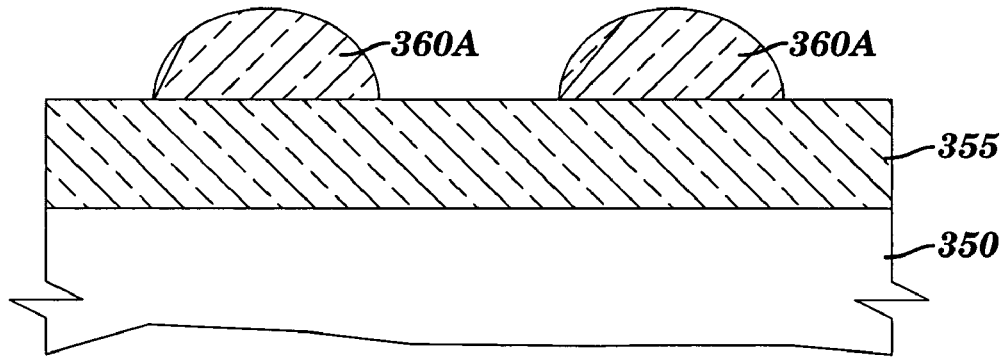

In FIG. 11B, photoresist islands 360 (see FIG. 11A) are reflowed to produce reflowed resist islands 360A.

Figure 11C:
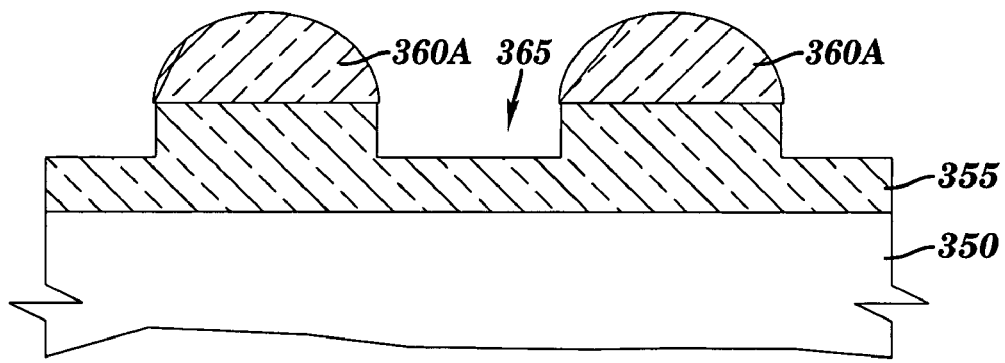

In FIG. 11C, an first RIE process with a high selectivity to reflowed resist islands 360A is performed to form trenches 365 in mandrel precursor layer 355. The exact RIE process is a function of the materials of layer 355 and the type of photoresist used and a person skilled in the art would be able to select an appropriate RIE process.

Figure 11D:
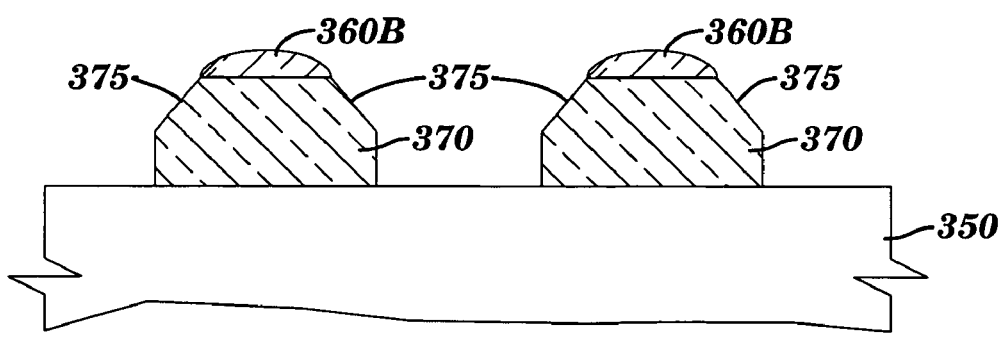

In FIG. 11D, an second RIE process with a low selectivity to reflowed resist islands 360A is performed to form mandrels 370. Mandrels 370 have angled surface 375 caused by etch back of reflowed resist islands 360A (see FIG. 11C) forming residual resist islands 360B. Residual resist islands 360B may now be removed by wet stripping or dry ashing.

Figure 12A:
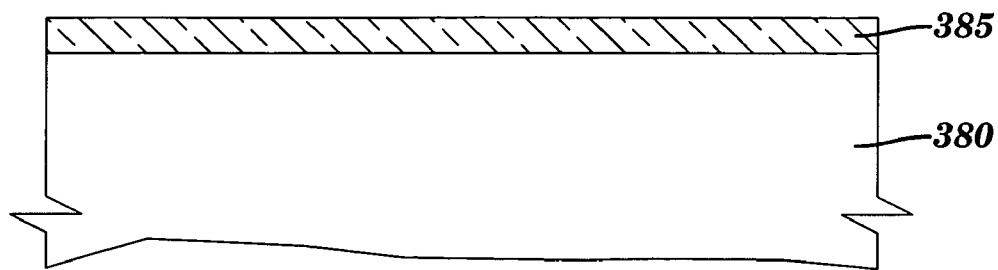
FIGS. 12A through 12D are partial cross-sectional views illustrating a fifth embodiment of the present invention.

FIGS. 12A through 12D are partial cross-sectional views illustrating a fifth embodiment of the present invention. In FIG. 12A formed on a (100) single crystal silicon substrate 380 (or a (100) single crystal silicon layer) is hard mask layer 385. Hard mask layer may be silicon oxide, silicon nitride, or other material not etched significantly by strong aqueous bases.

Figure 12B:
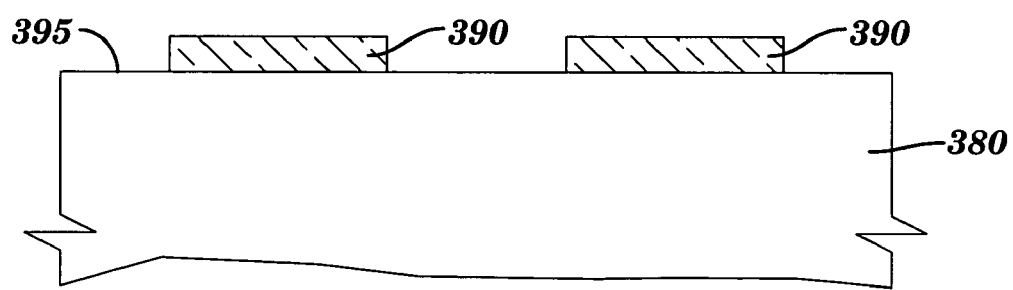

In FIG. 12B, hard mask layer 385 (see FIG. 12A) has been formed using one of any number of well known photolithographic/etch processes, into islands 390 exposing a top surface of substrate 380 between the islands.

Figure 12C:
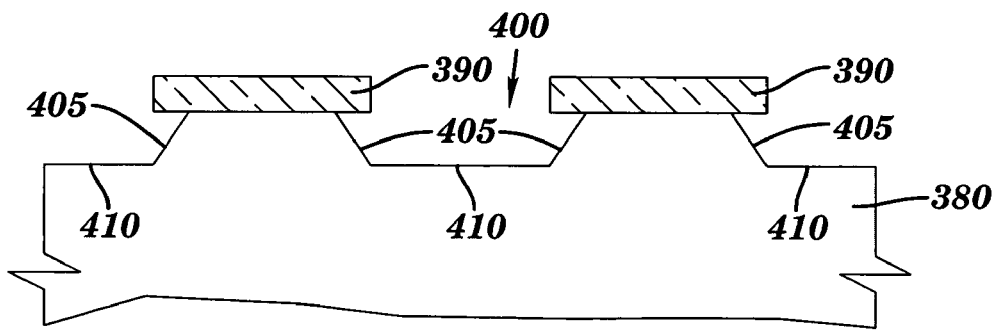

In FIG. 12C, substrate 380 trenches 400 formed in substrate 380. Trenches 400 have a bottom 410 and sloped sidewalls 405. Trenches 400 are formed by anisotropic etching substrate 380 in an aqueous or alcoholic solution of a strong base such as KOH, NaOH, tetramethylammonium hydroxide (TMAH) or ethylene diamine pyrocatechol (EDP.) Formation of sloped sidewalls in (100) silicon is well known. The slope is formed because the etch rate in the <111> crystallographic plane is faster than in any of the other planes.

Figure 12D:
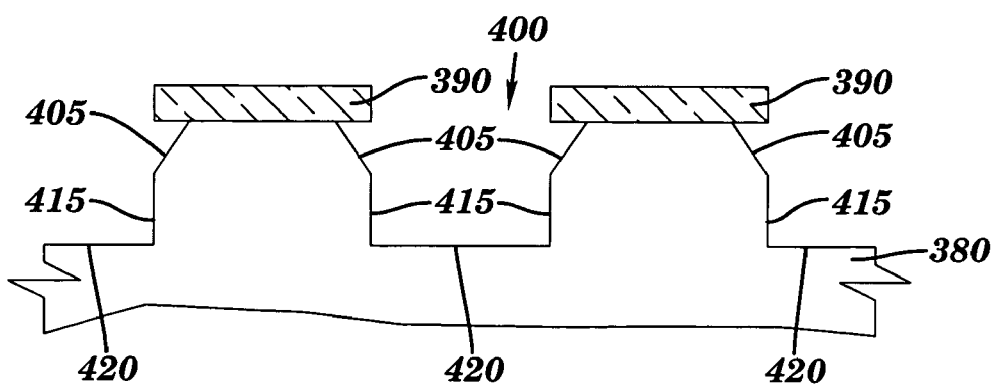

In FIG. 12D, a directional RIE process is performed deepening trench 400 and forming straight sidewalls 415 between sloped sidewalls and bottom 420. Islands 390 may now be removed.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A method of forming a structure having sub-lithographic dimensions, comprising the steps of:
   (a) forming a first hard mask layer on a substrate, said first hard mask layer comprising an upper layer and a lower layer, said lower layer of the first hard mask layer being in direct mechanical contact with the substrate;
   (b) forming a mandrel on the upper layer of first hard mask layer, said mandrel having a vertical sidewall, a top surface and a chamfered corner forming an angled surface, said angled surface being disposed between said vertical sidewall and said top surface a second edge of the angled surface being opposite a first edge of the angled surface;
   (c) forming a second hard mask layer over said chamfered mandrel and portions of said first hard mask layer not covered by said chamfered mandrel;
   (d) performing an angled ion implantation into said second hard mask layer to form an implanted region in said second hard mask layer and an implanted region in said second hard mask layer, said unimplanted region in said second hard mask layer substantially free of ions implanted by the angled ion implantation;
   (e) totally removing said implanted region in said second hard mask layer;
   (f) removing a portion of said unimplanted region and removing a portion of said mandrel exposed by step (c), to totally remove the chamfered corner thereby leaving a newly exposed top surface of the mandrel coplanar with a newly exposed surface of the unimplanted region, wherein step (f) leaves a remaining portion of the the unimplanted region consisting of a mutually perpendicular first and second portion, said first portion having a first surface in direct mechanical contact with the upper layer of the first hard mask layer and oriented parallel to the first mask, said second portion oriented perpendicular to the first hard mask layer;
   (g) after step (f), totally removing the mandrel, leaving the first surface of the unimplanted region as the only unexposed surface of the unimplanted region;
   (h) after step (g), removing all portions of the upper layer of the first hard mask layer that are not covered by the unimplanted region; and
   (i) after step (h), totally removing the unimplanted region and totally removing all portions of the lower layer of the first hard mask layer that is not protected by the upper layer of the first hard mask layer.

2. The method of claim 1, wherein said angled surface is formed by a sputtering process.

3. The method of claim 1, wherein said angled surface is formed by:
   forming a resist island on a mandrel precursor layer;
   reflowing said resist island to produce a reflowed resist island; and
   performing a first reactive ion etch having a high selectivity to said reflowed resist islands to produce a trench in said mandrel precursor layer; and
   performing a second reactive ion etch having a low selectivity to said reflowed resist islands layer to produce said mandrel.

4. The method of claim 1, wherein said angled surface is formed by:
   forming a patterned hard mask on a (100) silicon substrate or layer;
   performing a anisotropic etch to form a trench having angled sidewalls in said (100) silicon; and
   performing a reactive ion etch to form said mandrel.

5. The method of claim 1, wherein a value of the angle of said angled ion implantation is equal to, slightly greater than or slightly less than a value for the angle of said angled surface.

6. The method of claim 1, wherein a value the angle of said angled surface is between 52° and 54°, and wherein a value for the angle of said angled ion implantation is between 51° and 55°.

7. The method of claim 2, wherein said sputtering is performed using a species selected from the group consisting of argon, nitrogen and neon.

8. The method of claim 1, wherein said performing an angled ion implantation uses species selected from the group consisting of boron, phosphorus and oxygen.

9. The method of claim 1, wherein said chamfered mandrel is formed of material selected from the group consisting of tetraethoxysilane oxide, high-pressure deposition oxide and (100) silicon.

10. The method of claim 1, wherein said tinner layer of said first hard mask layer comprises $Si_3N_4$, and wherein said lower layer of said first hard mask layer comprises $SiO_2$.

11. The method of claim 1, wherein said second hard mask layer is formed of material selected from the group consisting of $Si_3N_4$ and polysilicon.

* * * * *